(12) United States Patent
Li et al.

(10) Patent No.: US 9,568,514 B2
(45) Date of Patent: Feb. 14, 2017

(54) POWER QUALITY EVENT LOCALIZATION BY MULTIPLE INDEXES

(71) Applicant: Rockwell Automation Technologies, Inc., Mayfield Heights, OH (US)

(72) Inventors: LingLai Li, Shanghai (CN); Benfeng Tang, Shanghai (CN); Fredrick M Discenzo, Mayfield Heights, OH (US); David Berman, Franklin, WI (US); Phillip Bush, Milwaukee, WI (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 488 days.

(21) Appl. No.: 14/293,812

(22) Filed: Jun. 2, 2014

(65) Prior Publication Data
US 2015/0331035 A1 Nov. 19, 2015

(30) Foreign Application Priority Data

May 19, 2014 (CN) .......................... 2014 1 0211198

(51) Int. Cl.
*G01R 31/00* (2006.01)
*G01R 15/00* (2006.01)
(Continued)

(52) U.S. Cl.
CPC ......... *G01R 19/2513* (2013.01); *G01R 31/086* (2013.01); *G01R 31/088* (2013.01);
(Continued)

(58) Field of Classification Search
CPC . G01R 31/086; G01R 31/088; G01R 19/2513; H02H 1/0092; H02J 13/0006
(Continued)

(56) References Cited

U.S. PATENT DOCUMENTS 3,569,785 A 3/1971 Durbeck et al.
3,931,502 A 1/1976 Kohlas
(Continued)

FOREIGN PATENT DOCUMENTS

DE 10017265 A1 10/2001
EP 0084191 B1 11/1982
(Continued)

OTHER PUBLICATIONS

Kazemi et al., Review of Voltage Sag Source Identification Methods for Power Quality Diagnosis, Przeglad Elektrotechniczny, ISSN 0033-2097, R. 89 NR Aug. 2013, pp. 143-149, University Kebangsaan Malaysia (UKM).
(Continued)

*Primary Examiner* — An Do
(74) *Attorney, Agent, or Firm* — Kunzler Law Group

(57) ABSTRACT

An apparatus includes an upstream/downstream probability module that determines, for each measurement point in an electrical power system, an upstream/downstream probability. The apparatus includes a zone module that identifies a plurality of zones within the power system and an upstream/downstream module that identifies, for each measurement point and for each zone, if a power quality event in a zone is upstream or downstream of a measurement point. The apparatus includes a zone probability module that determines a zone probability for each zone by multiplying the upstream probability or the downstream probability for each measurement point. The zone probability is a probability that the event happened in a zone. The zone probability module uses the upstream probability of a measurement point when the zone is upstream of the measurement point and uses the downstream probability when the zone is downstream of the measurement point.

22 Claims, 8 Drawing Sheets

(51) Int. Cl.

| | |
|---|---|
| *G01R 19/25* | (2006.01) |
| *G01R 31/08* | (2006.01) |
| *G06Q 50/06* | (2012.01) |
| *H02H 1/00* | (2006.01) |
| *H02H 7/26* | (2006.01) |
| *H02J 13/00* | (2006.01) |
| *H02J 3/38* | (2006.01) |

(52) U.S. Cl.
CPC ............ *G06Q 50/06* (2013.01); *H02H 1/0092* (2013.01); *H02H 7/261* (2013.01); *H02J 13/0006* (2013.01); *H02J 3/38* (2013.01)

(58) Field of Classification Search
USPC ............................... 702/57–59; 324/500, 512
See application file for complete search history.

(56) References Cited

U.S. PATENT DOCUMENTS

| | | | |
|---|---|---|---|
| 4,063,160 A | 12/1977 | Lanz et al. | |
| 4,063,162 A | 12/1977 | Lanz et al. | |
| 4,110,684 A | 8/1978 | Gale | |
| 4,128,805 A | 12/1978 | Lanz | |
| 4,224,672 A | 9/1980 | Leleu et al. | |
| 4,245,150 A | 1/1981 | Driscoll et al. | |
| 4,251,766 A | 2/1981 | Souillard | |
| 4,352,137 A | 9/1982 | Johns | |
| 4,362,986 A | 12/1982 | Burke et al. | |
| 4,446,458 A | 5/1984 | Cook | |
| 4,499,417 A | 2/1985 | Wright et al. | |
| 4,510,571 A | 4/1985 | Dagostino et al. | |
| 4,560,922 A | 12/1985 | Heller et al. | |
| 4,570,231 A | 2/1986 | Bunch | |
| 4,589,074 A | 5/1986 | Thomas et al. | |
| 4,591,992 A | 5/1986 | Yamaura | |
| 4,599,556 A | 7/1986 | Lanz | |
| 4,612,617 A | 9/1986 | Laplace, Jr. et al. | |
| 4,641,246 A | 2/1987 | Halbert et al. | |
| 4,694,402 A | 9/1987 | McEachern et al. | |
| 4,731,689 A | 3/1988 | Nimmersjo et al. | |
| 4,755,887 A | 7/1988 | Deaver et al. | |
| 4,774,621 A | 9/1988 | Andow | |
| 4,797,805 A | 1/1989 | Nimmersjo et al. | |
| 4,908,622 A | 3/1990 | Turai | |
| 5,151,866 A | 9/1992 | Glaser et al. | |
| 5,153,501 A | 10/1992 | Shimada et al. | |
| 5,216,621 A | 6/1993 | Dickens | |
| 5,224,054 A | 6/1993 | Wallis | |
| 5,229,651 A | 7/1993 | Baxter, Jr. et al. | |
| 5,233,538 A | 8/1993 | Wallis | |
| 5,343,404 A | 8/1994 | Girgis | |
| 5,453,744 A | 9/1995 | VanDeusen et al. | |
| 5,498,956 A | 3/1996 | Kinney et al. | |
| 5,528,134 A | 6/1996 | Davis et al. | |
| 5,568,399 A | 10/1996 | Sumic | |
| 5,587,917 A | 12/1996 | Elms | |
| 5,608,327 A | 3/1997 | Jones et al. | |
| 5,627,759 A | 5/1997 | Bearden et al. | |
| 5,706,204 A | 1/1998 | Cox et al. | |
| 5,717,325 A | 2/1998 | Leeb et al. | |
| 5,796,259 A | 8/1998 | Dickmander | |
| 5,808,902 A | 9/1998 | Levert et al. | |
| 5,819,203 A | 10/1998 | Moore et al. | |
| 5,825,656 A | 10/1998 | Moore et al. | |
| 5,828,983 A | 10/1998 | Lombardi | |
| 5,899,960 A | 5/1999 | Moore et al. | |
| 5,966,675 A | 10/1999 | Koeck | |
| 6,137,283 A | 10/2000 | Williams et al. | |
| 6,320,577 B1 | 11/2001 | Alexander | |
| 6,360,178 B1 | 3/2002 | Parsons et al. | |
| 6,415,244 B1 | 7/2002 | Dickens et al. | |
| 6,429,785 B1 | 8/2002 | Griffin et al. | |
| 6,449,570 B1 | 9/2002 | Wilstrup et al. | |
| 6,516,279 B1 | 2/2003 | Jansen et al. | |
| 6,615,147 B1 | 9/2003 | Jonker et al. | |
| 6,615,162 B2 | 9/2003 | Bar-Or | |
| 6,675,071 B1 | 1/2004 | Griffin, Jr. et al. | |
| 6,708,124 B2 | 3/2004 | Bilas et al. | |
| 6,792,364 B2 | 9/2004 | Jonker et al. | |
| 6,987,389 B1 | 1/2006 | Macbeth et al. | |
| 6,989,977 B2 | 1/2006 | Kase et al. | |
| 7,006,934 B2 | 2/2006 | Jonker et al. | |
| 7,016,796 B2 | 3/2006 | Damle et al. | |
| 7,106,045 B2 | 9/2006 | Jungwirth et al. | |
| 7,138,924 B2 | 11/2006 | Curtis | |
| 7,209,804 B2 | 4/2007 | Curt et al. | |
| 7,282,921 B2 | 10/2007 | Sela et al. | |
| 7,342,507 B2 | 3/2008 | Jonker et al. | |
| 7,403,364 B2 | 7/2008 | Anderson et al. | |
| 7,469,190 B2 | 12/2008 | Bickel | |
| 7,526,391 B2 | 4/2009 | Bickel | |
| 7,571,063 B2 | 8/2009 | Howell et al. | |
| 7,639,129 B2 | 12/2009 | Bickel et al. | |
| 7,751,993 B2 * | 7/2010 | Mirafzal ................. H02H 3/16 324/500 |
| 7,772,829 B2 | 8/2010 | Shuey | |
| 8,000,913 B2 | 8/2011 | Kreiss et al. | |
| 8,077,049 B2 | 12/2011 | Yaney et al. | |
| 8,160,824 B2 | 4/2012 | Spanier et al. | |
| 8,184,016 B2 | 5/2012 | Gray et al. | |
| 8,190,381 B2 | 5/2012 | Spanier et al. | |
| 8,280,656 B2 | 10/2012 | Kreiss et al. | |
| 8,285,500 B2 | 10/2012 | Kreiss et al. | |
| 8,290,727 B2 | 10/2012 | Kreiss et al. | |
| 8,336,352 B2 | 12/2012 | Abiprojo et al. | |
| 8,401,985 B2 | 3/2013 | Bickel et al. | |
| 2002/0027733 A1 | 3/2002 | Kikuta et al. | |
| 2002/0072867 A1 | 6/2002 | Parsons et al. | |
| 2002/0145517 A1 | 10/2002 | Papallo, Jr. et al. | |
| 2003/0014200 A1 | 1/2003 | Jonker et al. | |
| 2009/0187284 A1 | 7/2009 | Kreiss et al. | |
| 2009/0261805 A1 | 10/2009 | Shuey | |
| 2010/0013496 A1 | 1/2010 | Goetz | |
| 2010/0324845 A1 | 12/2010 | Spanier et al. | |
| 2011/0270454 A1 | 11/2011 | Kreiss et al. | |
| 2011/0270457 A1 | 11/2011 | Kreiss et al. | |
| 2011/0270550 A1 | 11/2011 | Kreiss et al. | |
| 2012/0050065 A1 | 3/2012 | Lombardi | |
| 2012/0209552 A1 | 8/2012 | Spanier et al. | |
| 2013/0110425 A1 | 5/2013 | Sharma et al. | |
| 2013/0123997 A1 | 5/2013 | King et al. | |

FOREIGN PATENT DOCUMENTS

| | | |
|---|---|---|
| WO | 0010018 | 2/2000 |
| WO | 0113132 A1 | 2/2001 |
| WO | 2012061014 A1 | 5/2012 |
| WO | 2013001355 | 1/2013 |

OTHER PUBLICATIONS

Wong Ling Al et al., A Single Monitor Method for Voltage Sag Source Location using Hilbert Huang Transform, Research Journal of Applied Sciences, Engineering and Technology 5(1): 192-202, 2013, ISSN: 2040-7459; e-ISSN: 2040-7467, © Maxwell Scientific Organization, 2013, Published: Jan. 1, 2013.

Eassa et al., Prediction of Electrical Power Quality Disturbances Using State Estimation Techniques, 18th International Conference on Electricity Distribution, Turin, Jun. 6-9, 2005.

Hamzah et al., A new approach to locate the voltage sag source using real current component, Electric Power Systems Research 72 (2004) 113-123.

Makaliki, Voltage Sag Source Location in Power Systems, Master Thesis, Institutionen för Energi och Miljö, Sweden, Dec. 2006.

Parsons et al., A Direction Finder for Power Quality Disturbances Based Upon Disturbance Power and Energy, Paper accepted for presentation at the 8th International Conference on Harmonics and Quality of Power ICHQP '98, jointly organized by IEEE/PES and NTUA, Athens, Greece, Oct. 14-16, 1998, pp. 693-699.

(56) References Cited

OTHER PUBLICATIONS

Polajzer et al., Generalization of Methods for Voltage-Sag Source Detection Using Vector-Space Approach, IEEE Transactions on Industry Applications, vol. 45, No. 6, Nov./Dec. 2009.
Dong-Jun Won, A New Algorithm to Locate Power-Quality Event Source With Improved Realization of Distributed Monitoring Scheme, IEEE Transactions on Power Delivery, vol. 21, No. 3, Jul. 2006.
EnerVista Viewpoint Monitoring, GE Digital Energy, http://www.gedigitalenergy.com/products/brochures/EVMon.pdf, 2005.
PQM II, power quality meter, Power Quality and Energy Cost Management, GE Energy, http://www.gedigitalenergy.com/products/brochures/pqmii.pdf, 2011.
Li et al., Method for voltage-sag-source detection by investigating slope of the system trajectory, IEE Proc.-Gener. Transm. Distrib., vol. 150, No. 3, May 2003.
Parsons et al., Rules for Locating the Sources of Capacitor Switching Disturbances, IEEE, pp. 794-799, Jul. 22, 1999.
Kim et al., A Time-Domain Procedure for Locating Switched Capacitors in Power Distribution Systems, IEEE Transactions on Power Delivery, vol. 17, No. 4, Oct. 2002.
Gengyin et al., Research on Power Quality Disturbance Automatic Recognition and Location, IEEE, pp. 687-691, Jul. 17, 2003.
Gu et al., Time-frequency and time-scale domain analysis of voltage disturbances, IEEE Transactions on Power Delivery, vol. 15, No. 4, Oct. 2000.
Powerlogic Solutions, Power Quality—Where Did That Event Come From?, www.powerlogic.com, vol. 7, Issue 2, Sep. 2003.
Schneider Electric, ION7550/ION7650—High performance meters for utility networks, mains or critical loads on HV/LV networks, http://www.schneider-electric.com/products/us/en/52500-power-and-energy-monitoring-system/52520-energy-and-power-quality-meters/1460-ion7550-ion7650/, Last retrieved May 16, 2014.
Schneider Electric, CM4000—High performance meters for mains or critical loads on HV/LV networks, http://www.schneider-electric.com/products/us/en/52500-power-and-energy-monitoring-system/52520-energy-and-power-quality-meters/921-cm4000/, Last retrieved May 16, 2014.
Dranetz, Modular Power Monitoring System: Encore, http://dranetz.com/encore-series, Last retrieved May 28, 2014.
Karl Zimmerman and David Costello, Fundamentals and Improvements for Directional Relays, Previously presented at the 2010 Texas A&M Conference for Protective Relay Engineers.
PQView, Capacitor Switching Answer Module, http://www.pqview.com/capswitch, Last retrieved May 28, 2014.
PQView, Sag Directivity Answer Module, http://www.pqview.com/sag-directivity, Last retrieved May 28, 2014.
PQView, PQView 3.61.0 Released, http://www.pqview.com/new/2009/7/24/pqview-3610-released.html, Jul. 24, 2009.
PQView, PQView 3.75.5 Released, http://www.pqview.com/new/2013/4/1/pqview-3755-released.html, Apr. 1, 2013.
PQView, PQView 3.76.0 Released, http://www.pqview.com/new/2013/10/24/pqview-3760-released.html, Oct. 24, 2013.
PQView, PQView 3.65.1 Released, http://www.pqview.com/new/2010/5/12/pqview-3651-released.html, May 12, 2010.
PQView—The Industry Standard for Power Quality Database Management and Analysis Software, http://www.pqview.com/, Last retrieved May 28, 2014.
Schweitser Engineering Laboratories, Detect More Faults Than Ever Before With Arc Sense Technology, https://www.selinc.com/ArcSense/, Last retrieved May 28, 2014.
Schweitser Engineering Laboratories, Legacy SEL-351 Directional Overcurrent and Reclosing Relay, https://www.selinc.com/LegacySEL-351/, Last retrieved May 28, 2014.
Schweitser Engineering Laboratories, SEL-PROFILE® Fault Locating Analysis Program, https://www.selinc.com/SEL-PROFILE/, Last retrieved May 28, 2014.

* cited by examiner

POWER QUALITY EVENT LOCALIZATION BY MULTIPLE INDEXES

CROSS-REFERENCE TO RELATED APPLICATIONS

This application claims priority to Chinese Patent Application Number 201410211198.8 entitled "POWER QUALITY EVEN LOCALIZATION BY MULTIPLE INDEXES" and filed on May 19, 2014 for LingLai Li, et al. the entire contents of which are incorporated herein by reference for all purposes. See MPEP §201.14.

FIELD

The subject matter disclosed herein relates to power quality events and more particularly relates to determining a location of a power quality event in an electrical power system.

BACKGROUND INFORMATION

Power quality events often occur within an electrical power system. A power quality event may be a voltage sag, a voltage swell, a transient, a fault condition, a frequency change, harmonics beyond a power quality limit, etc. A power quality event is typically detrimental to the delivery of electrical power, and is therefore undesirable. When a power quality event happens in an electrical power system, typically the power quality event is caused by a particular device or conductor within the electrical power system. The power quality event may affect multiple locations within the electrical power system. For example, a voltage sag caused by a load may affect panels and feeders upstream of the load. Often, a power quality event may occur over and over, for example, if a device in the electrical power system is about to fail. Locating the cause of the power quality event is desirable to diagnose and repair the component or conductor causing the power quality event. An electrical power system may include several power quality monitors that may be used to detect a power quality event and record waveforms associated with the power quality event. However, several power quality monitors may record data associated with the same power quality event.

BRIEF DESCRIPTION

An apparatus for locating a power quality event is disclosed. A system and method also perform the functions of the apparatus. The apparatus, in one embodiment, includes an upstream/downstream probability module that determines, for each measurement point in an electrical power system, an upstream/downstream probability. An upstream/downstream probability includes a probability that a power quality event was upstream of a measurement point and a probability that the power quality event was downstream of the measurement point. Each measurement point is within an electrical power system and the electrical power system includes a plurality of measurement points. The apparatus includes, in another embodiment, a zone module that identifies a plurality of zones within the electrical power system. A measurement point defines a boundary between zones in the electrical power system.

In one embodiment, the apparatus includes an upstream/downstream module that identifies, for each measurement point and for each zone, if a power quality event in a zone is upstream or downstream of a measurement point. The apparatus, in one embodiment, includes a zone probability module that determines a zone probability for each zone. The zone probability is a probability that the event happened in a zone. The zone probability module determines a zone probability for a zone by multiplying the upstream probability or the downstream probability for each measurement point where the zone probability module uses the upstream probability of a measurement point when the upstream/downstream module determines that the zone is upstream of the measurement point and uses the downstream probability of the measurement point when the upstream/downstream module determines that the zone is downstream of the measurement point.

In one embodiment, the apparatus includes a normalization module that normalizes each zone probability by dividing each zone probability by a sum of the zone probabilities determined by the zone probability module. In another embodiment, the apparatus includes an index module that, for a measurement point, calculates a plurality of indexes for the power quality event. The upstream/downstream probability module determines the upstream/downstream probability for the measurement point from the plurality of indexes for the measurement point. Each index of the plurality of indexes includes a probability that the power quality event occurred upstream or downstream of the measurement point. In another embodiment, the index module calculates an index for a measurement point by using an upstream/downstream prediction method that is based on measurement data taken at the measurement point and each index of the plurality of indexes is calculated using a different upstream/downstream prediction method.

In one embodiment, the apparatus includes an index weighting module that multiplies each index of a measurement point by a weighting factor to create a plurality of weighted indexes. The upstream/downstream probability module determines the upstream/downstream probability for the measurement point from the plurality of weighted indexes for the measurement point. In various embodiments, a weighting factor for an index is based on an overall reliability of an upstream/downstream prediction method used to determine the index, a reliability of an upstream/downstream prediction of the index based on measurement data of the power quality event measured at the measurement point, experimentation, simulation data, and a power quality event type.

In one embodiment, the apparatus includes a power quality monitor at each measurement point and also includes a synchronization module that sends a time of the event from a power quality monitor that detects the power quality event to each power quality monitor in the electrical power system where the upstream/downstream probability module determines the upstream/downstream probability of a measurement point relative to the time of the event. In a further embodiment, each power quality monitor includes a memory module that stores measurement data sufficient to include a time delay between the time of the event and when the memory module received the time of the event. The memory module stores measurement data sufficient for the upstream/downstream probability module to determine the upstream/downstream probability of a measurement point.

In another embodiment, the memory module for a power quality monitor further stores pre-event data for a measurement point for a time prior to the earlier of a time corresponding to the time of the event received from another power quality monitor that detected the power quality event and a time corresponding to when the power quality monitor of the measurement point detects the power quality event. In another embodiment, the memory module for a power quality monitor further stores event data and/or post-event data for a measurement point. The event data and post-event data are from a time after the later of a time corresponding to the time of the event received from another power quality monitor that detected the power quality event and a time corresponding to when the power quality monitor of the measurement point detects the power quality event, plus an amount of time sufficient for the upstream/downstream probability module to determine the upstream/downstream probability of a measurement point. In another embodiment, the synchronization module also determines if a power quality event detected by a power quality monitor at a measurement point corresponds to a power quality event detected by a different power quality monitor at a different measurement point and merges the power quality event detected by the power quality monitor at the measurement point with the power quality event detected by the different power quality monitor at the different measurement point in response to the synchronization module determining that the events are the same power quality event.

In one embodiment, the apparatus includes a probability weighting module that multiplies each upstream probability or downstream probability for a measurement point used by the zone probability module by a probability weighting factor prior to the zone probability module determining a zone probability. In another embodiment, the probability weighting factor is determined by a location of a zone with respect to a measurement point corresponding to the upstream probability or downstream probability, a power quality event type, an amount of current flow at the measurement point corresponding to the upstream probability or downstream probability, criticality of loads fed by power lines at the measurement point corresponding to the upstream probability or downstream probability, and/or historical data from previous determinations of zone probability in relation to determined causes for previous power quality events. In another embodiment, the apparatus includes a zone probability module that compares the zone probabilities to determine a highest zone probability. The zone probability module reports the zone with the highest zone probability as the zone where the event most likely occurred.

A method for locating a power quality event in an electrical power system includes, in one embodiment, determining, for each measurement point in an electrical power system, an upstream/downstream probability. An upstream/downstream probability includes a probability that a power quality event was upstream of a measurement point and a probability that the power quality event was downstream of the measurement point where each measurement point is within an electrical power system and the electrical power system includes several measurement points. The method, in one embodiment, includes identifying a plurality of zones within the electrical power system, wherein a measurement point defines a boundary between zones in the electrical power system and identifying, for each measurement point and for each zone, if a power quality event in a zone is upstream or downstream of a measurement point.

The method, in one embodiment, includes determining a zone probability for each zone. The zone probability is a probability that the event happened in a zone. The zone probability is determined for a zone by multiplying, for each measurement point, the upstream probability or the downstream probability where determining a zone probability includes using the upstream probability of a measurement point when the zone is upstream of the measurement point and using the downstream probability of the measurement point when the zone is downstream of the measurement point.

In one embodiment, the method includes normalizing each determined probability by dividing a probability for a zone by a sum of the zone probabilities determined for each zone, and for a measurement point, calculating a plurality of indexes for the power quality event. Determining an upstream/downstream probability for a measurement point includes using the plurality of indexes for the measurement point. Each index of the plurality of indexes includes a probability that the power quality event occurred upstream or downstream of the measurement point. In another embodiment, the method includes multiplying each index of a measurement point by a weighting factor to create a plurality of weighted indexes, and determining an upstream/downstream probability for a measurement point includes using the plurality of weighted indexes for the measurement point.

In one embodiment, the electrical power system includes a power quality monitor at each measurement point and the method includes sending a time of the event from a power quality monitor that detects the power quality event to each power quality monitor in the electrical power system where determining the upstream/downstream probability of a measurement point is relative to the time of the event. In another embodiment, the method includes multiplying each upstream probability or downstream probability for a measurement point by a probability weighting factor prior to determining a zone probability.

A system for locating a power quality event in an electrical power system includes a plurality of power quality monitors where each power quality monitor is located at a measurement point in an electrical power system. The system, in one embodiment, includes an index module that, for a measurement point, calculates a plurality of indexes for a power quality event. Each index is calculated using measurement data for the power quality event from the power quality monitor at the measurement point and the index module calculates a plurality of indexes for each measurement point. The system, in one embodiment, includes an upstream/downstream probability module that determines, for each measurement point, an upstream/downstream probability using the plurality of indexes for the measurement point. An upstream/downstream probability is a probability that the power quality event was upstream of a measurement point and a probability that the power quality event was downstream of the measurement point. The system, in one embodiment, includes a zone module that identifies a plurality of zones within the electrical power system, where a measurement point defines a boundary between zones in the electrical power system, and includes an upstream/downstream module that identifies, for each measurement point and for each zone, if a power quality event in a zone is upstream or downstream of a measurement point.

The system, in one embodiment, includes a zone probability module that determines a zone probability for each zone. A zone probability is a probability that the event happened in a zone. The zone probability module determines a zone probability for a zone by multiplying the upstream probability or the downstream probability for each measurement point, where the zone probability module uses the upstream probability of a measurement point when the upstream/downstream module determines that the zone is upstream of the measurement point and uses the downstream probability of the measurement point when the upstream/ downstream module determines that the zone is downstream of the measurement point. In one embodiment, the system includes a communication network that facilitates communication between the power quality monitors and the system includes a synchronization module that sends a time of the event from a power quality monitor that detects the power quality event to each power quality monitor in the electrical power system. The upstream/downstream probability module determines the upstream/downstream probability of a measurement point relative to the time of the event.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
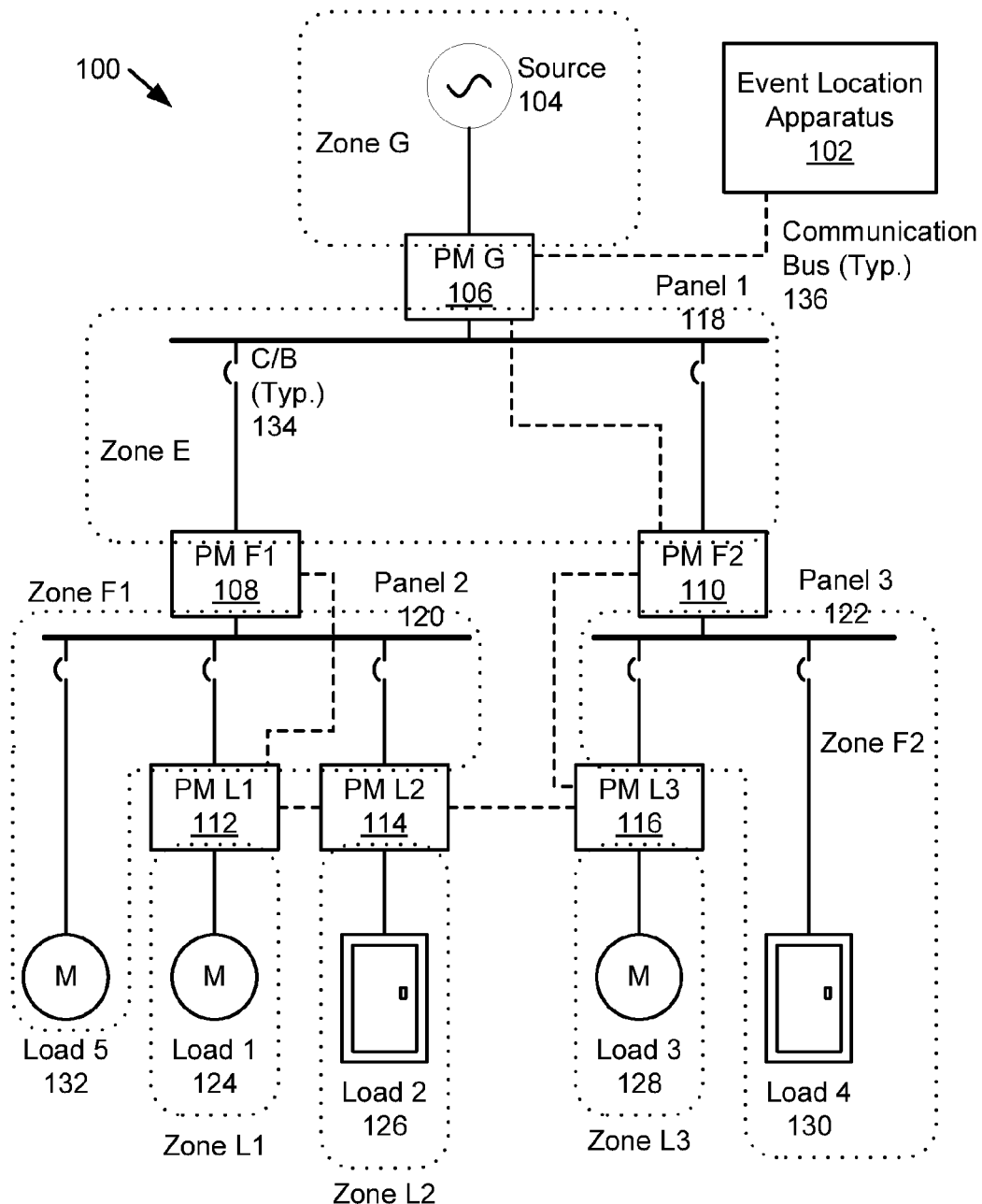
FIG. 1 is a schematic block diagram illustrating one embodiment of a system for predicting a location of a power quality event.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer readable medium may be a tangible computer readable storage medium storing the program code. The computer readable storage medium may be, for example, but not limited to, electronic storage media, magnetic storage media, optical storage media, electromagnetic storage media, infrared storage media, holographic, micromechanical storage media, or semiconductor system storage media, apparatus, or device, or any suitable combination of the foregoing.

More specific examples of the computer readable storage medium may include but are not limited to a portable computer diskette, a hard disk, a random access memory ("RAM"), a read-only memory ("ROM"), an erasable programmable read-only memory ("EPROM" or Flash memory), a portable compact disc read-only memory ("CD-ROM"), a digital versatile disc or digital video disk ("DVD"), an optical storage device, a magnetic storage device, a holographic storage medium, a micromechanical storage device, or any suitable combination of the foregoing. In the context of this document, a computer readable storage medium may be any tangible medium that can contain, and/or store program code for use by and/or in connection with an instruction execution system, apparatus, or device.

The computer readable medium may also be a computer readable signal medium. A computer readable signal medium may include a propagated data signal with program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport program code for use by or in connection with an instruction execution system, apparatus, or device. Program code embodied on a computer readable signal medium may be transmitted using any appropriate medium, including but not limited to wire-line, optical fiber, Radio Frequency (RF), or the like, or any suitable combination of the foregoing In one embodiment, the computer readable medium may include a combination of one or more computer readable storage mediums and one or more computer readable signal mediums. For example, program code may be both propagated as an electro-magnetic signal through a fiber optic cable for execution by a processor and stored on RAM storage device for execution by the processor.

Program code for carrying out operations for aspects of the present invention may be written in any combination of one or more programming languages, including an object oriented programming language such as Java, Smalltalk, C++, PHP or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider). The computer program product may be shared, simultaneously serving multiple customers in a flexible, automated fashion.

The computer program product may be integrated into a client, server and network environment by providing for the computer program product to coexist with applications, operating systems and network operating systems software and then installing the computer program product on the clients and servers in the environment where the computer program product will function. In one embodiment software is identified on the clients and servers including the network operating system where the computer program product will be deployed that are required by the computer program product or that work in conjunction with the computer program product. This includes the network operating system that is software that enhances a basic operating system by adding networking features.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by program code. The program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The program code may also be loaded onto a computer, other programmable data processing apparatus, or other devices to cause a series of operational steps to be performed on the computer, other programmable apparatus or other devices to produce a computer implemented process such that the program code which executed on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

FIG. 1 is a schematic block diagram illustrating one embodiment of a system 100 for predicting a location of a power quality event. The system 100 includes an event location apparatus 102, a power source 104, a power quality ("PQ") monitor G 106, PQ monitor F1 108, PQ monitor F2 112, PQ monitor L1 112, PQ monitor L2 114, PQ monitor L3 116, Panel 1 118, Panel 2 120, Panel 3 122, Load 1 124, Load 2 126, Load 3 128, Load 4 130, Load 5 132, overcurrent protection (typical) 134, and a communication bus 136, which are described below.

The system 100 includes an electrical power system capable of delivering electrical power from a source 104 to various loads (e.g. 124-132). FIG. 1 is a one-line diagram of a typical electrical power system. One of skill in the art will recognize that many other configurations of an electrical power system are possible and that the one-line diagram includes a single line between components that represent multiple conductors, including phase conductors, grounded conductors (e.g. a neutral), grounding conductors, and the like.

The system 100 includes one embodiment of an event location apparatus 102. The event location apparatus 102 determines a probability that a power quality event occurred within a zone of the electrical power system. Various embodiments of the event location apparatus 102 are described in more detail with respect to the apparatuses 200, 300 of FIGS. 2 and 3.

The system 100, in one embodiment, includes a power source 104. The power source 104 may be a feed from an electrical utility, may be a generator, a solar power source, a wind driven turbine, an uninterruptable power supply, a battery, or any other electrical power source and associated equipment that can deliver electrical power to the electrical power system.

The system 100 includes several measurement points. In the depicted embodiments, the measurement points are represented with a PQ monitor, such as PQ monitor G 106, PQ monitor F1 108, PQ monitor F2 112, PQ monitor L1 112, PQ monitor L2 114, and PQ monitor L3 116. One of skill in the art will recognize that each PQ monitor may sense voltage, current, frequency, etc. using current transformers, sensing lines for sensing voltage, etc. without actually physically being in series with conductors as shown in FIG. 1. Each PQ monitor 106-116, in one embodiment, is in a location close to where the PQ monitor is shown in the system 100 of FIG. 1. In another embodiment, each PQ monitor 106-116 merely represents a measurement point and the PQ monitors may be in another location, some may be grouped together, etc.

In one embodiment, each PQ monitor 106-116 includes an ability to detect a power quality event. For example, a power quality event may be voltage sag, voltage swell, a transient, a change in frequency, a short circuit condition, etc. In another embodiment, some of the PQ monitors 106-116 include the capability to detect a power quality event and are capable of transmitting the time of the event to the other PQ monitors 106-116. In one embodiment, a power quality event may be an event that exceeds a power quality standard, such as the Institute of Electrical and Electronic Engineers ("IEEE") 519 standards for harmonic content, like total harmonic distortion ("THD"), total demand distortion ("TDD"), individual harmonics over a limit, etc., or IEEE 1159 standards for power quality. For example, a PQ monitor 106-116 may detect a PQ event as a voltage that exceeds a voltage swell limit, a voltage sag limit, a frequency deviation limit, etc. set in IEEE 1159. In another embodiment, each PQ monitor 106-116 may also detect a PQ event based on a setting input by a user. One of skill in the art will recognize other ways that a PQ monitor 106-116 may detect a power quality event.

In another embodiment, each PQ monitor 106-116 includes an ability to store data before and after a power quality event. For example, a PQ monitor 106-116 may store pre-event data from some time before the power quality event to the time of the power quality event. In another embodiment, each PQ monitor 106-116 stored event data. Event data, in one example, is from a start of a power quality event until the power quality event is over, for example, when voltages and currents are within specified ranges or within the specified ranges for a predetermined period of time. In another embodiment, each PQ monitor 106-116 stores post-event data for a time period after a power quality event is over. The pre-event data, event data, and/or post-event data may be sufficient to determine if the event is predicted to have occurred upstream or downstream of the measurement point associated with the PQ monitor 106-116. Storing pre-event data, event data, and post-event data will be discussed in more detail below with respect to synchronization of events.

In one embodiment, each PQ monitor 106-116 may communicate with each other. In another embodiment, each PQ monitor 106-116 communicates with the event location apparatus 102. For example, the PQ monitors 106-116 may communicate using a communication bus 136. The communication bus may be EtherNet/IP™ Common Industrial Protocol ("CIP"), Modbus®, International Electrotechnical Commission ("IEC") 60870, IEC 61850, Profibus, SCADA (supervisory control and data acquisition), FOUNDATION fieldbus, or other communication protocol. In one embodiment, the PQ monitors 106-116 are daisy-chained together with the communications bus 136. In another embodiment, the PQ monitors 106-116 are connected to a router, switch, etc. The communication bus 136, may include cables, routers, switches, servers, wireless routers, and other communication equipment. The communication bus 136, in one embodiment, includes multiple communications buses. For example, the communication bus 136 may include a local area network ("LAN"), wireless network, the Internet, etc. One of skill in the art will recognize other ways for the PQ monitors 106-116 to communicate.

The system 100, in one embodiment, includes panels, such as Panel 1 118, Panel 2 120, and Panel 3 122. Panel 1 118, in one embodiment, is a service entrance panel where electrical power enters a facility, for example when the power source 104 is an electrical utility. Panel 1 may be a distribution panel, switchgear, a substation, a motor control center ("MCC"), etc. and includes multiple branches protected by overcurrent protection. The electrical power system depicted includes circuit breakers (e.g. C/B 134), but one of skill in the art will recognize that the overcurrent protection may include fuses, protective relays, or other overcurrent protection known to those of skill in the art. In the electrical power system depicted in FIG. 1, Panel 1 118 feeds sub-panels Panel 2 120 and Panel 3 122. A typical electrical power system may include a panel similar to Panel 1 118 that feeds multiple sub-panels and two panels 120, 122 are shown for simplicity.

Panel 2 120 is shown feeding Load 1 124, which is a motor load, Load 2 126, which is a branch panel, and Load 5, which is also a motor. Panel 3 122 is shown feeding Load 3 128, which is a motor, and Load 4 130, which is another branch panel. Other electrical systems may have additional sub-panels, MCCs, disconnects, etc. One of skill in the art will recognize that other power systems may have a variety of load types and configurations, and may include multiple sources 104 and that other electrical power systems may be configured in various ways. In addition, the electrical power system of the system 100 of FIG. 1 may be a power system for a building, a campus, an industrial plant, an electrical power utility system, a battery power system, or any other electrical power system that may include multiple measurement points associated with a plurality of PQ monitors 106-116.

Figure 2:
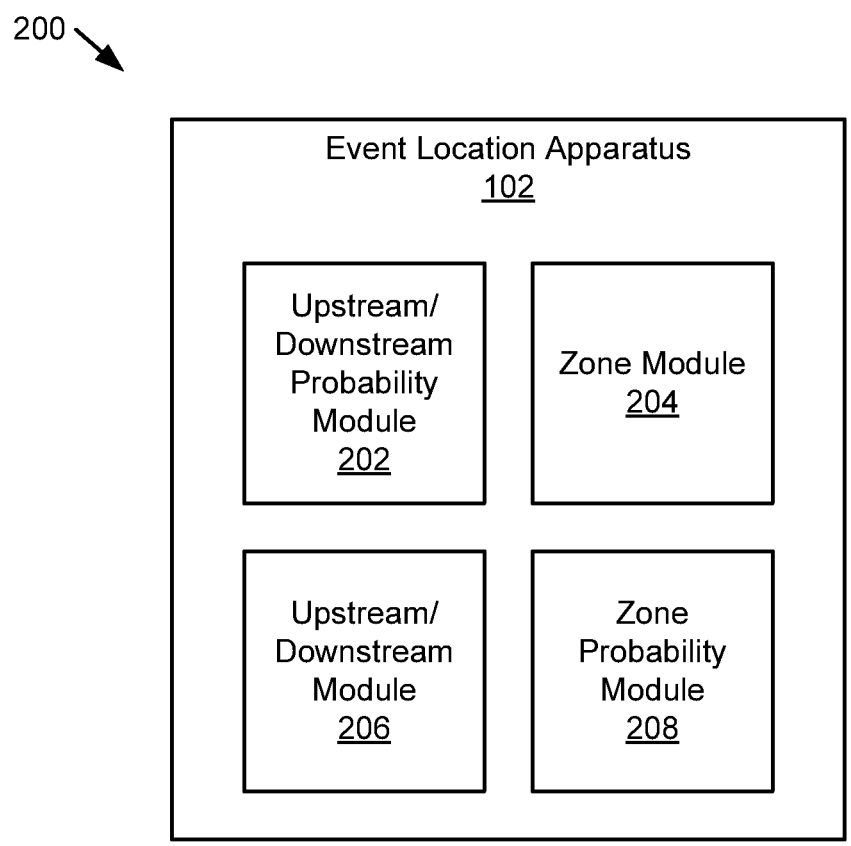
FIG. 2 is a schematic block diagram illustrating one embodiment of an apparatus for predicting a location of a power quality event.

FIG. 2 is a schematic block diagram illustrating one embodiment of an apparatus 200 for predicting a location of a power quality event. The apparatus 200 includes one embodiment of an event location apparatus 102 with an upstream/downstream probability module 202, a zone module 204, an upstream/downstream module 206, and a zone probability module 208, which are described below.

In one embodiment, the apparatus includes an upstream/downstream probability module 202 that determines, for each measurement point in the electrical power system, an upstream/downstream probability. An upstream/downstream probability includes a probability that a power quality event was upstream of a measurement point and a probability that the power quality event was downstream of the measurement point. Each measurement point is located within the electrical power system and the electrical power system includes more than one measurement point. For a typical electrical power system, power flows in a particular direction. Hereinafter, upstream of a measurement point is defined as in a direction toward the power source from which power flows in a direction toward where the current is coming from and downstream of the measurement point is defined as toward a load in a direction toward the load where power is flowing through the measurement point to the load.

In one embodiment, a PQ monitor 106-116 includes the upstream/downstream probability module 202 and the upstream/downstream probability module 202 uses measurement data from the PQ monitor 106-116 to determine the upstream/downstream probability. In another embodiment, the upstream probability and the downstream probability are between zero and one. In another embodiment, if the downstream probability is p, then the upstream probability is 1−p. For example, the upstream/downstream probability module 202 may determine a downstream probability p and then determine an upstream probability as 1−p. In other embodiments, the upstream/downstream probability module 202 may express the upstream/downstream probability in another form, such as a percentage or on some other basis other than zero to one. The upstream/downstream probability module 202 may use any form of upstream/downstream probability that conveys a relative probability that the power quality event happened upstream of the measurement point or downstream of the measurement point. One of skill in the art will recognize other ways to express an upstream/downstream probability.

The apparatus 200, in one embodiment, includes a zone module 204 that identifies a plurality of zones within the electrical power system. Typically, a measurement point defines a boundary between zones in the electrical power system. For example, one zone may include the portion of the electrical power system between PQ monitor G 106, PQ monitor F1 108, and PQ monitor F2 110, including Panel 1 118 and feeders to PQ monitor F1 108 and to PQ monitor F2 110 and from Panel 1 118 to PQ monitor G 106. The zone is designated as Zone E on FIG. 1. Another zone is upstream of PQ monitor G 106 and is designated as Zone G on FIG. 1.

Another zone is downstream of PQ monitor F1 108 and upstream of PQ monitor L1 112 and upstream of PQ monitor L2 114 and is designated as Zone F1 on FIG. 1. Zone F1 includes Panel 2 120 and the feeders to PQ monitor F1 108, PQ monitor L1 112, PQ monitor L2 114, the feeder to Load 5 132 as well as Load 5 132. Another zone is downstream of PQ monitor F2 110 and upstream of PQ monitor L3 116 and is designated as Zone F2 on FIG. 1. Zone F2 includes Panel 3 122 and the feeders to PQ monitor F2 110, PQ monitor L3 116, the feeder to Load 4 130 as well as Load 4 130. Zone F2 may also include any branch circuits and loads of the branch panel depicted as Load 4 130.

Typically a zone includes the equipment and feeders that are between two measurement points because a power quality event downstream of one of the measurement point and upstream of the other measurement point could occur anywhere in the feeders and equipment between the two measurement points. For a last measurement point in a branch, a power quality event downstream of the measurement point typically could occur anywhere downstream of the measurement point.

In one embodiment, the zone module 204 analyzes an electrical power system topology to identify zones. In another embodiment, the zone module 204 receives zone information from a user to identify zones in the electrical power system. In another embodiment, the zone module 204 identifies zones in the electrical power system using a matrix. For example, columns or rows could each represent a zone. One of skill in the art will recognize other ways that the zone module 204 may identify zones in the electrical power system.

In one embodiment, the apparatus 200 includes an upstream/downstream module 206 that identifies, for each measurement point and for each zone, if a power quality event in a zone is upstream or downstream of a measurement point. For example, at the measurement point defined by PQ monitor F1 108, a power quality event in Zone G, Zone E, Zone F2, or Zone L3 would be upstream of PQ monitor F1 108 while a power quality event in Zone F1, Zone L1, or Zone L2 would be downstream of PQ monitor F1 108. In the example electrical power system depicted in FIG. 1, the upstream/downstream module 206 would make a similar determination for PQ monitor G 106, PQ monitor F2 110, PQ monitor L1 112, PQ monitor L2 114, and PQ monitor L3 116. In one embodiment, the upstream/downstream module 206 creates a matrix that identifies possible power quality event locations as upstream or downstream of each measurement point. The matrix, in one embodiment, is input by a user. In another embodiment, the matrix is generated by the apparatus 200. The matrix may be in the form of a table, a database, etc. A possible matrix for the example electrical power system of FIG. 1 is identified in Table 1.

TABLE 1

|    | PM G | PM F1 | PM F2 | PM L1 | PM L2 | PM L3 |
|----|------|-------|-------|-------|-------|-------|
| G  | Up   | Up    | Up    | Up    | Up    | Up    |
| E  | Down | Up    | Up    | Up    | Up    | Up    |
| F1 | Down | Down  | Up    | Up    | Up    | Up    |
| F2 | Down | Up    | Down  | Up    | Up    | Up    |
| L1 | Down | Down  | Up    | Down  | Up    | Up    |
| L2 | Down | Down  | Up    | Up    | Down  | Up    |
| L3 | Down | Up    | Down  | Up    | Up    | Down  |

In Table 1, each row is a zone and G is Zone G, E is Zone E, F1 is Zone F1, F2 is Zone F2, L1 is Zone L1, L2 is Zone L2, and L3 is Zone L3. Also, each column is a measurement point where PM G is PQ monitor G 106, PM F1 is PQ monitor F1 108, PM F2 is PQ monitor F2 110, PM L1 is PQ monitor L1 112, PM L2 is PQ monitor L2 114, and PM L3 is PQ monitor L3 116. One of skill in the art will recognize other ways that the upstream/downstream module 206 may represent determined whether a power quality event in a zone is upstream or downstream of a measurement point.

In one embodiment, the apparatus 200 includes a zone probability module 208 that determines a zone probability for each zone. The zone probability is a probability that the event happened in a zone. The zone probability module 208 determines a zone probability for a zone by multiplying the upstream probability or the downstream probability for each measurement point. The zone probability module 208 uses the upstream probability of a measurement point when the upstream/downstream module 206 determines that the zone is upstream of the measurement point and uses the downstream probability of the measurement point when the upstream/downstream module 206 determines that the zone is downstream of the measurement point.

In one embodiment, a zone probability for measurement point k may be determined as indicated in Equation 1:

$$ZP(x) = \prod_k p_k^{(x)} \tag{1}$$

where $ZP(x)$ is the zone probability for zone x and $p_k^{(x)}$ is the applicable upstream probability or downstream probability, as determined by the upstream/downstream module 206, for zone x relative to measurement point k. For example, the zone probability for Zone F1 may be calculated as in Equation 2:

$$ZP(F1)=(1-p(G))\cdot(1-p(E))\cdot p(F1)\cdot(1-p(F2))\cdot p(L1)\cdot p(L2)\cdot(1-p(L3)) \tag{2}$$

where, for example, the upstream probability of the measurement point corresponding to PQ monitor G 106 is $(1-p(G))$ where $p(G)$ is the downstream probability at PQ monitor G 106, and the downstream probability of the measurement point corresponding to PQ monitor F1 108 is $p(F1)$.

In one embodiment, the upstream/downstream probability module 202 returns a downstream probability p for each measurement point and the apparatus 200 recognizes that an upstream probability corresponding to a measurement point is $1-p$. In the embodiment, the upstream/downstream module 206 may create a matrix where an "Up" is "upstream" and is represented as a "−1" and a "Down" is "downstream" and is represented as a "1." In the embodiment, downstream probabilities from the upstream/downstream probability module 202 may then be multiplied by the "1" or "−1" of Table 1 and negative values may be added to 1 to get upstream probabilities. Once the proper upstream or downstream probabilities for a zone are determined, the zone probability module 208 may multiply the resulting probabilities to get the zone probability.

Figure 3:
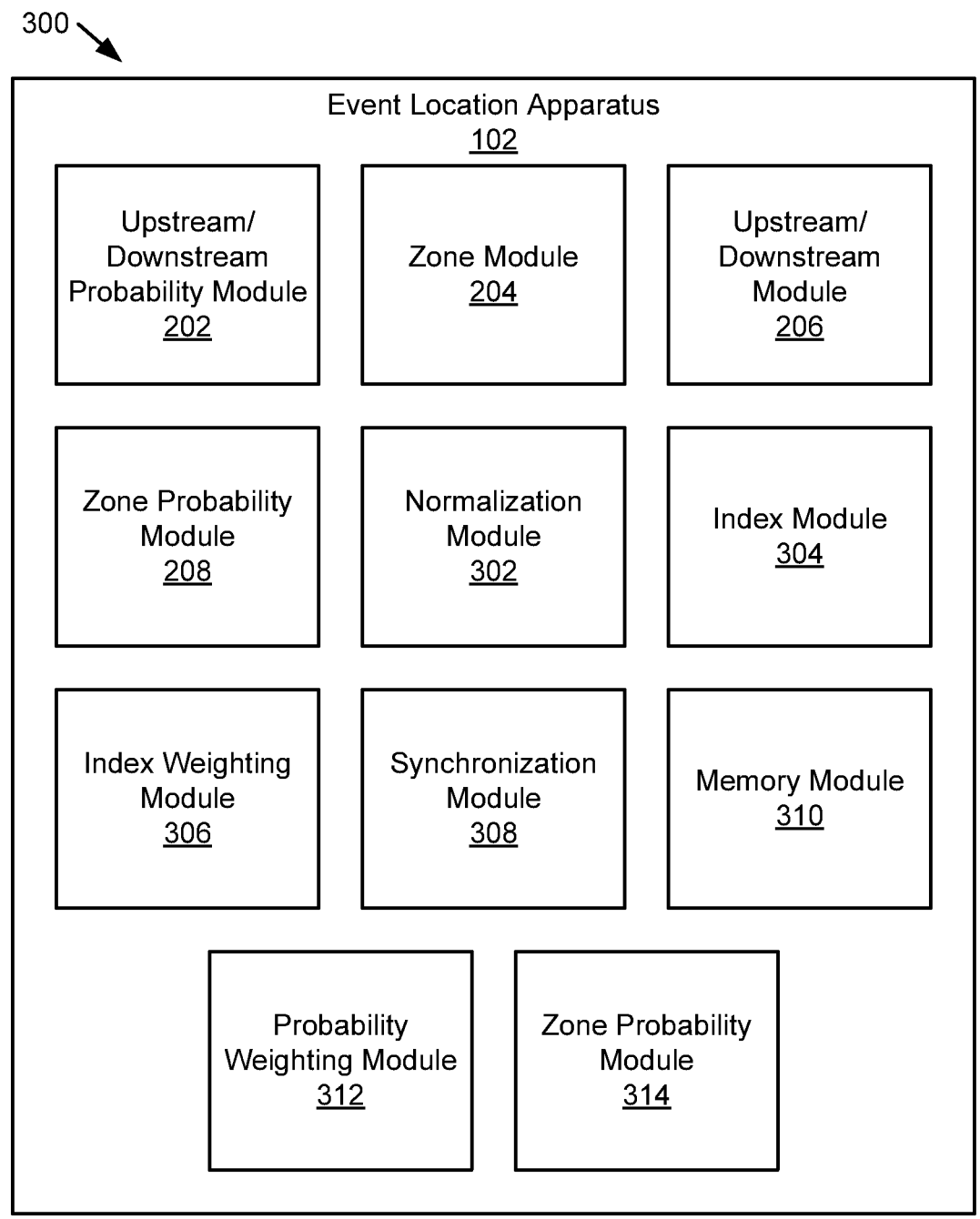
FIG. 3 is a schematic block diagram illustrating another embodiment of an apparatus for predicting a location of a power quality event.

FIG. 3 is a schematic block diagram illustrating another embodiment of an apparatus 300 for predicting a location of a power quality event. The apparatus 300 includes another embodiment of the event location apparatus 102 with an upstream/downstream probability module 202, a zone module 204, an upstream/downstream module 206, and a zone probability module 208, which are substantially similar to those described above in relation to the apparatus 200 of FIG. 2. In various embodiments, the apparatus 300 may also include a normalization module 302, an index module 304, an index weighting module 306, a synchronization module 308, a memory module 310, a probability weighting module 312, and a zone probability module 314, which are described below.

In one embodiment, the apparatus 300 includes a normalization module 302 that normalizes each zone probability by dividing each zone probability by a sum of the zone probabilities determined by the zone probability module 208. For example, the normalization module 302 may normalize each zone probability $ZP(x)$ as in Equation 3:

$$ZP_n(x) = \frac{ZP(x)}{\sum_x ZP(x)} \tag{3}$$

For example, in the example electrical power system of FIG. 1, the normalized zone probability for Zone E may be as in Equation 4:

$$ZP_n(E) = \frac{ZP(E)}{ZP(G) + ZP(E) + ZP(F1) + ZP(F2) + ZP(L1) + ZP(L2) + ZP(L3)} \tag{4}$$

In one embodiment, where upstream/downstream probabilities are expressed as values between zero and one, the zone normalization module may result in zone probabilities between zero and one.

In another embodiment, the apparatus 300 includes an index module 304 that, for a measurement point, calculates more than one index for the power quality event. The upstream/downstream probability module 202 determines the upstream/downstream probability for the measurement point from the plurality of indexes for the measurement point. An index is an upstream/downstream probability determined by a particular upstream/downstream prediction method for predicting upstream probability and/or downstream probability at a measurement point within an electrical power system. Each upstream/downstream prediction method may have strengths and weaknesses. The strengths and weaknesses may be a result of the particular power quality event, system topology, particular measurement results, etc. or may be a result of the particular upstream/downstream prediction method used.

In one embodiment, the index module 304 calculates an index for a measurement point by using an upstream/downstream prediction method that is based on measurement data taken at the at the measurement point. For example, the PQ monitor at the measurement point may detect a power quality event or may receive a time of the event from another PQ monitor that detected the power quality event and have pre-event, event data and/or post-event measurement data available. The index module 304 may use a particular upstream/downstream prediction method along with the measurement data to determine an index.

In one embodiment, each index of the plurality of indexes is calculated using a different upstream/downstream prediction method. The index module 304 may also use the measurement data for the same power quality event along with other upstream/downstream prediction methods to create other indexes. The upstream/downstream probability module 202 may then use the indexes from the index module 304 to determine an upstream/downstream probability for the power quality event at the measurement point. Using multiple indexes may increase reliability of an upstream/downstream probability over using a single index to create the upstream/downstream probability.

In one embodiment, the index module 304 creates an index that corresponds to a prediction of "upstream" or "downstream." For example, the index may be a "1" for a downstream prediction and a "0" for an upstream prediction. In another embodiment, the index is a probability. The probability may be between zero and one.

In one embodiment, the apparatus 300 includes an index weighting module 306 that multiplies each index of a measurement point by a weighting factor to create a plurality of weighted indexes. The upstream/downstream probability module 202 then determines the upstream/downstream probability for the measurement point from the plurality of weighted indexes for the measurement point. In one embodiment, a weighting factor may be between zero and one. In another embodiment, the index weighting module 306 may normalize the weighted indexes to that the resulting upstream/downstream probability from the upstream/downstream probability module 202 is between zero and one.

In one example, if the index module 304 calculates five indexes for a power quality event at a measurement point, the index weighting module 306 may create a weighting factor for each index so that a sum of the indexes results in an upstream/downstream probability between zero and one. The weighting factors may be 0.4, 0.15, 0.15, 0.2, and 0.1 for the five indexes. The first weighting factor may be most reliable and the last weighting factor least reliable with the three middle weighting factors having a reliability somewhere in between the first and last. If the indexes are either a zero or a one, when each of the five indexes is multiplied by its respective weighting factor, the upstream/downstream probability module 202 may then sum the five weighted indexes to determine an upstream/downstream probability. As an example, if the five indexes are 1, 1, 0, 1, and 0, then the resulting weighted indexes may be 0.4, 0.15, 0, 0.2, and 0. The upstream/downstream probability module 202 may then sum the weighted indexes with a resulting downstream probability of 0.75 and an upstream probability of 0.25.

Various methods may be used to determine the weighting factors. In one example, a weighting factor may be based on an overall reliability of an upstream/downstream prediction method used to determine the index. In another embodiment, a weighting factor may be relative and may be based on a reliability of an upstream/downstream prediction of the index based on measurement data of the power quality event measured at the measurement point. For example, certain measurement data may result in a prediction that is less reliable so the weighting factor may be adjusted accordingly. Other factors may also be used to determine a weighting factor, such as experimentation, simulation data, and the power quality event type. For example, a particular upstream/downstream prediction method may be more reliable for three-phase to ground faults than for single-phase to ground faults. In another example, simulation data may reveal that a particular upstream/downstream prediction method is more reliable for a particular topology than other upstream/downstream prediction methods. One of skill in the art will recognize other ways to determine weighting factors to be applied to indexes.

There are several known types of upstream/downstream prediction methods that are currently available. For example, there are several upstream/downstream prediction methods that are Disturbance Power and Energy ("DPE") based methods. One such method calculates DP and DE indices where the DP index is applied to calculate the difference between delivered steady-state power during voltage sag and the DE index is applied to calculate the integral of the disturbance power during the voltage sag.

Another upstream/downstream prediction method is based on reactive power in addition to disturbance power and energy calculations. Another upstream/downstream prediction method looks at instantaneous power which can be further decomposed into instantaneous active and reactive power and based on a Hilbert transform. Another category of upstream/downstream prediction methods is the Slope of System Trajectory ("SST") and Resistance Sign ("RS") based methods. SST methods are based on the relation between the voltage and current during a fault. An RS based method for voltage sag uses the sign of resistance.

The above mentioned upstream/downstream prediction methods are a few of the methods known in the art. Many other upstream/downstream prediction methods are also known in the art, including variations of the above mentioned methods. Several are discussed in the article "Review of Voltage Sag Source Identification Methods for Power Quality Diagnosis," by Asadollah Kazemi, et al., Przeglaqd Elektrotechniczny, ISSN 0033-2097, August 2013, which is herein incorporated by reference. Each upstream/downstream method has advantages and disadvantages. Some upstream/downstream methods are more effective under certain conditions or for certain types of fault. By using more than one upstream/downstream method, the index module 304 provides a more robust way of determining upstream/downstream probability that relying on a single method.

In one embodiment, the apparatus 300 includes a synchronization module 308 that sends a time of the event from a PQ monitor (e.g. 106) that detects the power quality event to each PQ monitor (e.g. 108-116) in the electrical power system. The upstream/downstream probability module 202 determines the upstream/downstream probability of a measurement point relative to the time of the event. In another embodiment, each PQ monitor 106-116 includes a memory module 310 that stores measurement data sufficient to include a time delay between the time of the event and when the memory module 310 received the time of the event. The memory module 310 typically stores measurement data sufficient for the upstream/downstream probability module 202 to determine the upstream/downstream probability of a measurement point. Sufficient measurement data, as described herein, includes enough measurement data to determine the upstream/downstream probability for the particular upstream/downstream probability methods being used to determine the upstream/downstream probability.

Various methods may require different amounts of measurement data and more measurement data may improve accuracy. One of skill in the art will recognize how much measurement data to store.

For example, the memory module 310 may store enough data points within a cycle of the voltage and current waveforms to identify variations within the waveform indicative of a power quality event. For example, the memory module 310 may store at least 10 data points per half cycle for each measurement channel. A measurement channel may be a voltage measurement, a current measurement, etc. In a three-phase power system the memory module 310 may store voltage date for each phase, a neutral, a grounding conductor, current data for each phase, the neutral, the grounding conductor, and other measurements known to those of skill in the art. In another embodiment, the memory module 310 stores 1024 data points per cycle. In other embodiments, the memory module 310 may store 10,000 data points per cycle. In other embodiments, the PQ monitor and memory module 310 may store instantaneous data or RMS data. The PQ monitor may also have additional features and capabilities. One example of a PQ monitor capable of the functions described herein is the PowerMonitor 5000™ by Allen-Bradley®.

More than one PQ monitor may detect the power quality event. In one embodiment, a PQ monitor (e.g. 108) receives a time of the event from another PQ monitor (e.g. 106) where the time of the event is the time that the other PQ monitor (e.g. 106) detected the power quality event. A memory module 310 of a PQ monitor (e.g. 108) may store pre-event data from a time that is the earlier of a time when the PQ monitor (e.g. 108) detects the power quality event and the time of the event received from the other PQ monitor (e.g. 106). For example, if a first PQ monitor (e.g. 108) receives a time of the event T1 from a second PQ monitor (e.g. 106), and the first PQ monitor (e.g. 108) detects the power quality event at time T2, and time T1 is before time T2, the memory module 310 of the PQ monitor (e.g. 108) may store pre-event data from a time before T1.

Also, the memory module 310 of a PQ monitor (e.g. 108) may store event data and/or post-event data from a time that is the later of the time when the PQ monitor (e.g. 108) detects the power quality event, T2, and the time of the event received from the other PQ monitor (e.g. 106), T1. The memory module 310 of the PQ monitor (e.g. 108) may store event data/post-event data from a time after T2 plus an amount of time sufficient for the upstream/downstream probability module 202 to determine the upstream/downstream probability of a measurement point.

In one embodiment, the synchronization module 308 also determines if a power quality event detected by a PQ monitor at a measurement point (e.g. 108) corresponds to a power quality event detected by a different PQ monitor (e.g. 106) at a different measurement point and merges the power quality event detected by the PQ monitor (e.g. 108) at the measurement point with the power quality event detected by the different PQ monitor (e.g. 106) at the different measurement point in response to the synchronization module 308 determining that the events are the same power quality event. For example, the synchronization module 308 may determine that both power quality events are a voltage sag and are merely offset by time, which may indicate that the power quality events detected by the PQ monitors (e.g. 106, 108) are the same power quality event. The synchronization module 308 may match power quality events based on event type, waveform shape, duration, and other measurement characteristics to determine if two power quality events measured at different PQ monitors (e.g. 106, 108) are indeed the same power quality event.

In one embodiment, the apparatus includes a probability weighting module 312 that multiplies each upstream probability or downstream probability for a measurement point used by the zone probability module 208 by a probability weighting factor prior to the zone probability module 208 determining a zone probability. For example, an upstream/downstream probability may be for a zone that is distant from a zone probability being calculated so a weighting factor may discount the upstream/downstream probability. For example, when the zone probability module 208 is determining the zone probability for Zone F1, the upstream probability of PQ monitor L3 116 may be used, but PQ monitor L3 116 is distant from Zone F1 as compared to PQ monitor F1 108, PQ monitor L1 112, and PQ monitor L2 114 so a probability weighting factor that de-emphasizes the upstream probability from PQ monitor L3 116 may be applied.

Probability weighting factors may be based on other factors. For example, a probability weighting factor may take into account a power quality event type. In another example, a probability weighting factor may take into account an amount of current flow at the measurement point corresponding to the upstream probability or downstream probability. For instance, a measurement point with more current may be deemed more important, more critical, potentially more damaging, may serve a larger load, etc. than a measurement point with a lower amount of current so a probability weighting factor may be adjusted accordingly. In another example, a measurement point with more current during a power quality event may indicate a location closer to the fault, a larger branch which may be more critical, etc. In another example, a probability weighting factor may take into account criticality of loads fed by power lines at the measurement point corresponding to the upstream probability or downstream probability. More critical loads may justify a probability weighting factor that increases importance of an upstream/downstream probability. In another example, a probability weighting factor may take into account historical data from previous determinations of zone probability in relation to determined causes for previous power quality events. One of skill in the art will recognize other factors in determining a probability weighting factor to be applied by the probability weighting module 312.

In one embodiment, the apparatus 300 includes a zone probability module 314 that compares the zone probabilities to determine a highest zone probability. The zone probability module 314 then reports the zone with the highest zone probability as the zone where the event most likely occurred. The zone probability module 314 may report zone probabilities with no particular order, may report a zone name for the zone with the highest zone probability, may report a highest zone probability, may report zone probabilities for all zones in the electrical power system in an order from highest to lowest, may plot zone probabilities on a graphical display of the electrical power system, etc. One of skill in the art will recognize other information and formats for information from the zone probability module 314.

Figure 4:
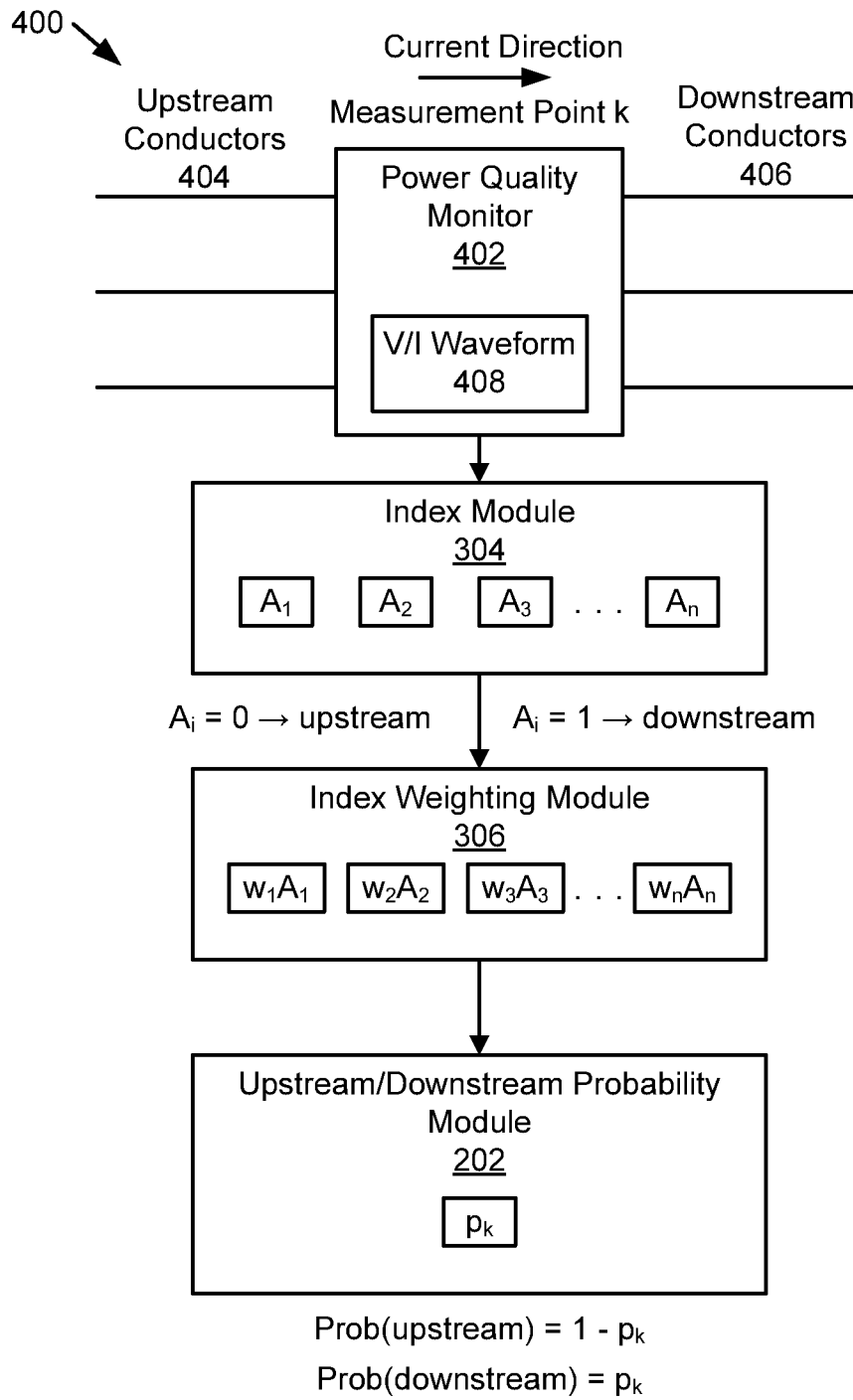
FIG. 4 is a schematic block diagram illustrating one embodiment of an apparatus for predicting an upstream/downstream probability of a power quality event at a measurement point.

FIG. 4 is a schematic block diagram illustrating one embodiment of an apparatus 400 for predicting an upstream/downstream probability of a power quality event at a measurement point. The apparatus 400 includes a power quality monitor 402 in line with three upstream conductors 404 and three downstream conductors 406 representing three phases of an electrical supply to a load of some type. Current direction is depicted so that the upstream conductors 404 have current going toward the power quality monitor 402 and the downstream conductors 406 have current going away from power quality monitor 402. The power quality monitor 402 may represent any of the power quality monitors 106-116 in FIG. 1.

The power quality monitor 402 has voltage and current waveforms 408 from a power quality event, which may be stored in a memory module 310 in the power quality monitor 402 or may be stored in a device external to the power quality monitor 402. The index module 304 receives the voltage and current waveforms 408 and generates several indexes $A_1$-$A_n$. An index is zero for an upstream event and one for a downstream event. In other embodiments, each index may be expressed as a probability with a value between zero and one or some other value, such as a percentage.

In the embodiment of FIG. 4, the apparatus 400 includes an index weighting module 306 that multiplies each index $A_n$ by a weighting factor $w_n$. The apparatus 400 also includes an upstream/downstream probability module 202 that receives the weighted indexes $w_1A_1$-$w_nA_n$ and calculates an upstream/downstream probability, where the downstream probability is $p_k$ and the upstream probability is $1-p_k$. The upstream/downstream probability may then be used by the zone probability module 208 to determine a zone probability.

Figure 5:
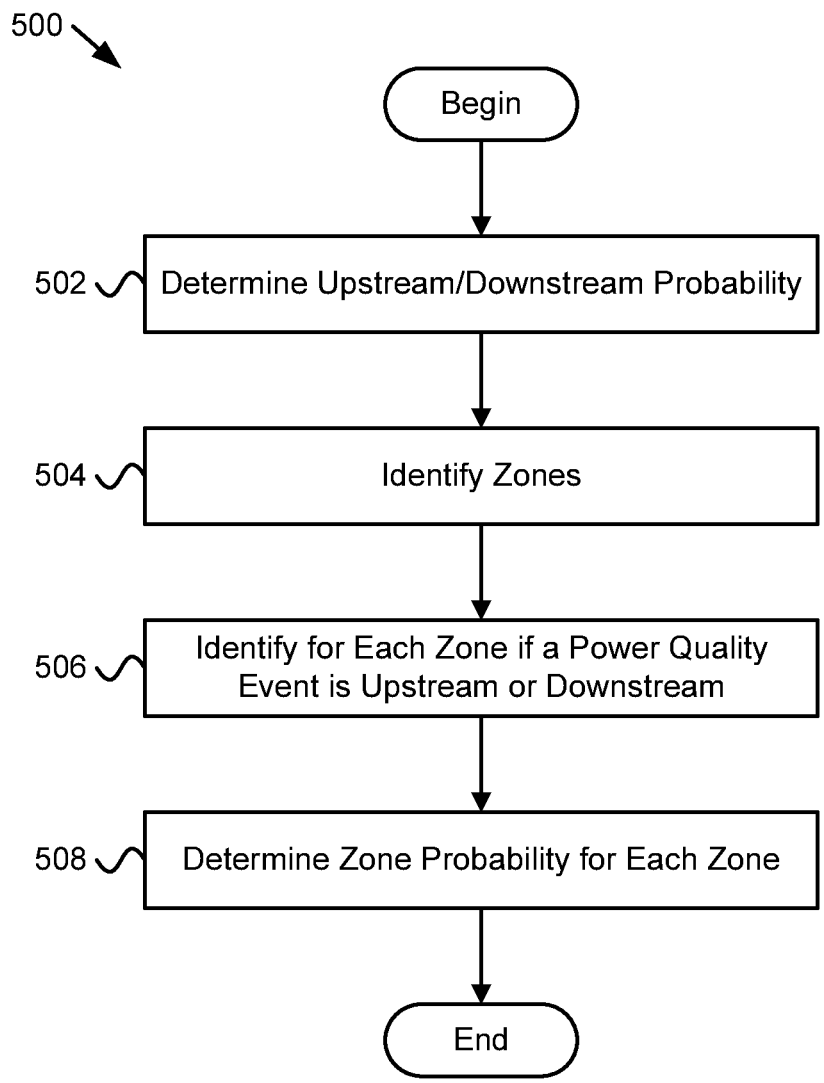
FIG. 5 is a schematic flow chart diagram illustrating one embodiment of a method for predicting a location of a power quality event.

FIG. 5 is a schematic flow chart diagram illustrating one embodiment of a method 500 for predicting a location of a power quality event. The method 500 begins and determines 502 an upstream/downstream probability for a power quality event at each measurement point of an electrical power system. In one embodiment, the upstream/downstream probability module 202 determines 502 the upstream/downstream probabilities. The method 500 identifies 504 zones in the electrical power system. Each measurement point is a boundary between zones and zones may also be downstream of a last measurement point or upstream of a measurement point in a source feeder. The source feeder may connect to a power source, such as an electric utility, a generator, a battery system, etc. or even a distribution panel where there are no other measurement points upstream of the measurement point. In one embodiment, the zone module 204 identifies 504 the zones.

The method 500 identifies 506 at a measurement point, for each zone, if a power quality event is upstream or downstream of the measurement point. The method 500 may identify 506 if the power quality event is upstream or downstream of a measurement point for each measurement point in the electrical power system. For example, the upstream/downstream module 206 may identify 506 at a measurement point if the power quality event is upstream or downstream of the measurement point. The method 500 determines 508 a zone probability for each zone, and the method 500 ends. The zone probability module 208 may determine 508 the zone probability for each zone. One of skill in the art will recognize that the method 500 may identify 504 zones and identify 506 if the power quality event is upstream or downstream of a measurement point for each measurement point in the electrical power system prior to a power quality event.

Figure 6A:
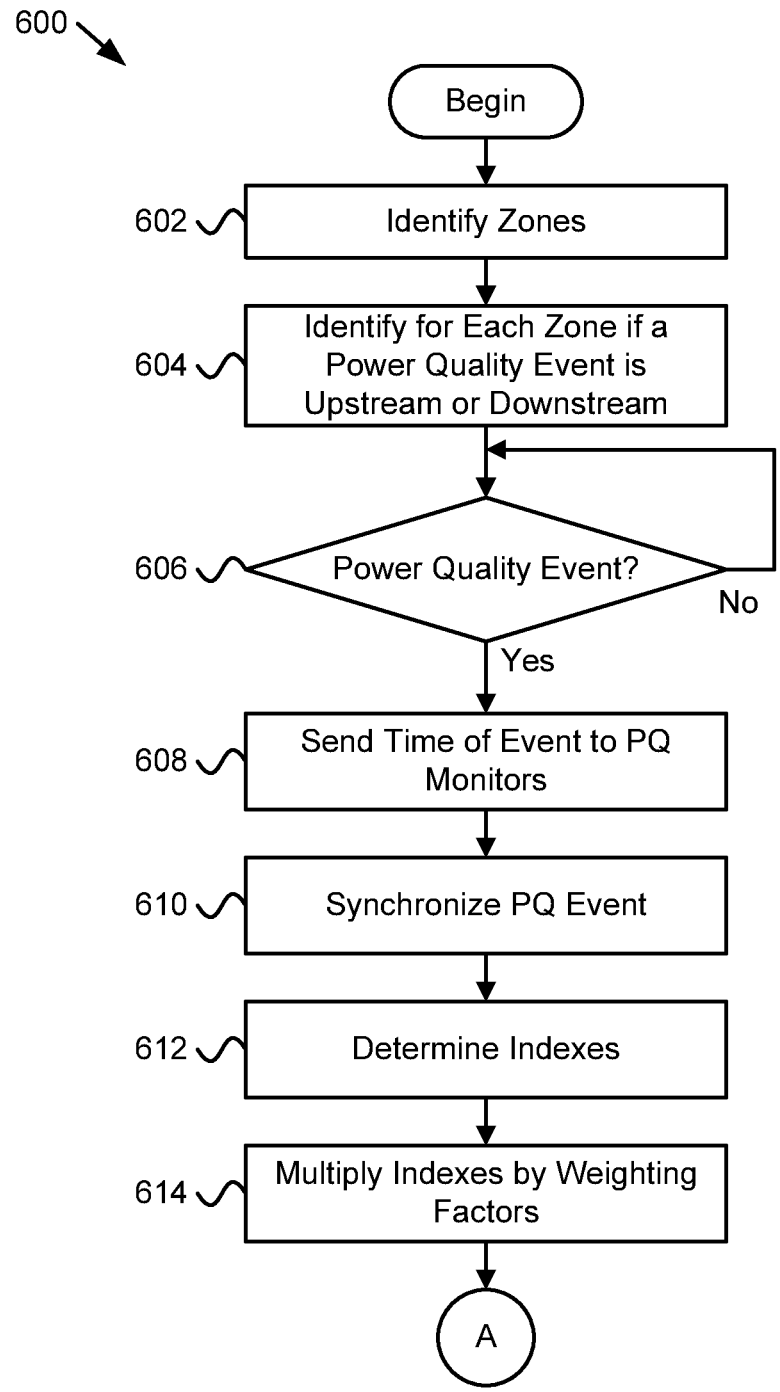
FIG. 6A is a first part of a schematic flow chart diagram illustrating another embodiment of a method for predicting a location of a power quality event.
Figure 6B:
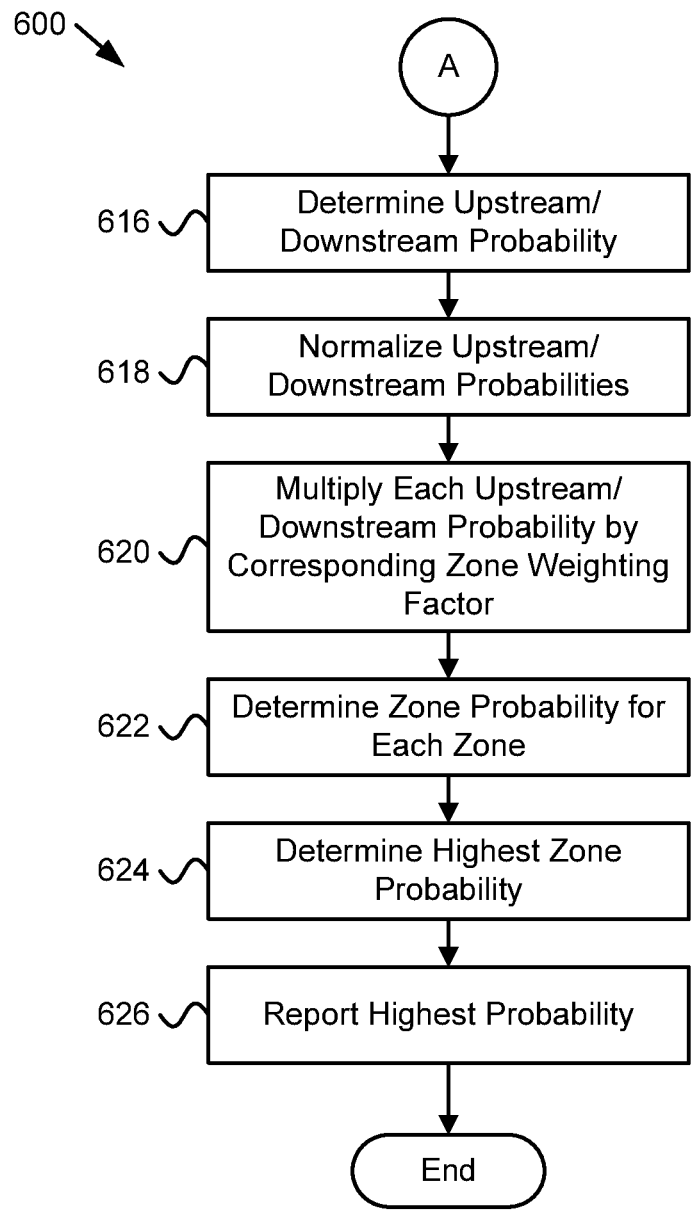
FIG. 6B is a second part of a schematic flow chart diagram illustrating another embodiment of a method for predicting a location of a power quality event.

FIG. 6A is a first part and FIG. 6B is a second part (collectively FIG. 6) of a schematic flow chart diagram illustrating another embodiment of a method 600 for predicting a location of a power quality event. The method 600 begins and identifies 602 zones in an electrical power system. The zone module 204 may identify 602 the zones in the electrical power system. The method 600 identifies 604 if a power quality event is upstream or downstream of a measurement point for each measurement point in the electrical power system. The upstream/downstream module 206 may identify 604 if a power quality event is upstream or downstream of a measurement point for each measurement point in the electrical power system.

The method 600 determines 606 if there is a power quality event. If the method 600 determines 606 that there is no power quality event, the method 600 returns and continues to determine 606 if there is a power quality event. A PQ monitor (e.g. 106) may determine 606 if there is a power quality event. If the method 600 determines 606 that there is a power quality event, the method 600 sends the time of the event to other PQ monitors (e.g. 108-116) in the electrical power system. A PQ monitor (e.g. 106) may send 608 the time of the event to the other PQ monitors.

The method 600, in one embodiment, synchronizes 610 power quality events detected by multiple PQ monitors 106-116. The synchronization module 308, in one embodiment, synchronizes the power quality event. The method 600 determines 612 several indexes at each measurement point for the power quality event and optionally multiplies 614 the indexes by weighting factors to create weighted indexes. In various embodiments, the index module 304 may determine 612 the indexes and/or the index weighting module 306 may multiply 614 the indexes by the weighting factors. The method 600 determines 616 an upstream/downstream probability at each measurement point in the electrical power system (follow "A" on FIG. 6A to "A" on FIG. 6B). The upstream/downstream probability module 202 may determine 616 the upstream/downstream probabilities.

The method 600 optionally normalizes 618 each upstream/downstream probability. For example, the method 600 may sum the upstream/downstream probabilities and may divide each upstream/downstream probability by the sum of the upstream/downstream probabilities. The normalization module 302 may normalize 618 each upstream/downstream probability. The method 600 optionally multiplies 620 each upstream/downstream probability by a corresponding zone weighting factor. In one embodiment, the probability weighting module 312 multiplies 620 each upstream/downstream probability by a corresponding zone weighting factor.

The method 600 determines 622 a zone probability for each zone, optionally determines 624 a highest zone probability, and optionally reports 626 the highest zone probability, and the method 600 ends. The zone probability module 208, in one embodiment, determines 622 a zone probability for each zone. The zone probability module 208, in another embodiment, determines 624 a highest zone probability and reports 626 the highest zone probability and may also report other information, including other zone probabilities, corresponding zones, a diagram of the electrical power system with the zone probabilities, etc.

Figure 7:
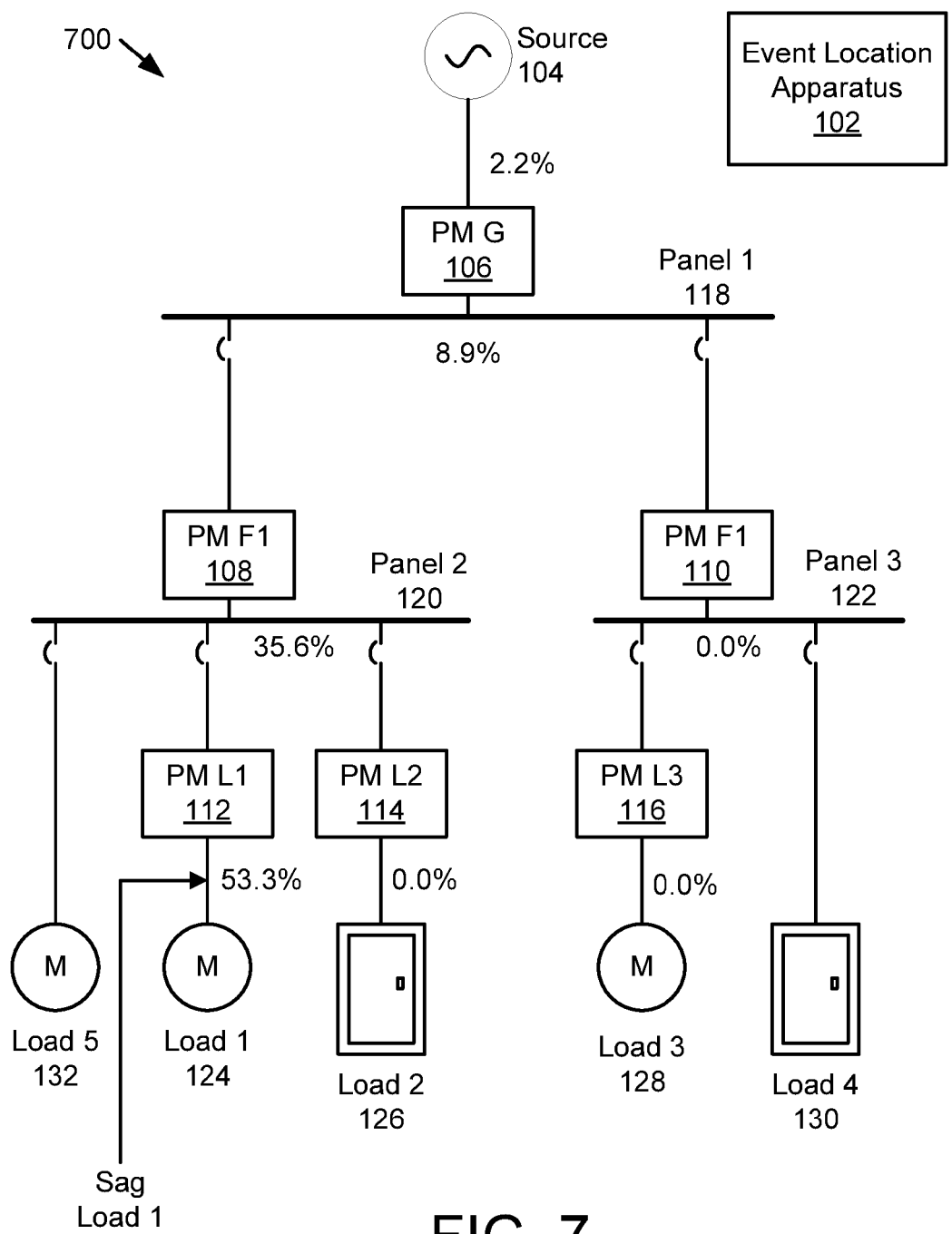
FIG. 7 is a schematic block diagram illustrating one example of predicting a location of a power quality event for a system.

FIG. 7 is a schematic block diagram illustrating one example 700 of predicting a location of a power quality event for a system. The example 700 includes an electrical power system that is similar to the electrical power system of FIG. 1. In the example 700, a power quality event occurs at Load 1 124 in the form of a voltage sag. PQ monitor L1 112 may be the first to detect the power quality event and may send the time of the event to the other PQ monitors 106-110, 114, 116. Each PQ monitor 106-116 may then have a memory module 310 that stores pre-event data, event data and post-event data. Each PQ monitor 106-116 may also include a synchronization module 308 that synchronizes power quality events where the power quality events are determined to be the power quality event detected by PQ monitor L1 112. Each PQ monitor 106-116 may also include an index module 304 that creates multiple indexes based on the pre-event data, event data, and post-event data for the power quality event.

Each PQ monitor 106-116 may also include an upstream/downstream probability module 202 that determines, for a measurement point corresponding to a PQ monitor location, an upstream/downstream probability from the indexes created by the index module 304 at the measurement point. In one embodiment, each PQ monitor also includes and index weighting module 306 that multiplies each index by a corresponding weighting factor prior to the upstream/downstream probability module 202 creating the upstream/downstream probability. For example, the upstream/downstream probabilities may be as indicated in Table 2.

TABLE 2

|  | PM G | PM F1 | PM F2 | PM L1 | PM L2 | PM L3 |
|---|---|---|---|---|---|---|
| Downstream Probability | 0.8 | 0.8 | 0 | 0.6 | 0 | 0 |
| Upstream Probability | 0.2 | 0.2 | 1 | 0.4 | 1 | 1 |

The PQ monitor names are the same as for Table 1 above. Table 2 is then used to determine whether the upstream probability or the downstream probability is to be used in determining zone probabilities. Table 3 includes the appropriate upstream probability or downstream probability.

TABLE 3

|  | PM G | PM F1 | PM F2 | PM L1 | PM L2 | PM L3 | Zone Prob. | Norm. Zone Prob. |
|---|---|---|---|---|---|---|---|---|
| G | 0.2 | 0.2 | 1 | 0.4 | 1 | 1 | 0.016 | 0.022 |
| E | 0.8 | 0.2 | 1 | 0.4 | 1 | 1 | 0.064 | 0.089 |
| F1 | 0.8 | 0.8 | 1 | 0.4 | 1 | 1 | 0.256 | 0.356 |
| F2 | 0.8 | 0.2 | 0 | 0.4 | 1 | 1 | 0 | 0 |
| L1 | 0.8 | 0.8 | 1 | 0.6 | 1 | 1 | 0.384 | 0.533 |
| L2 | 0.8 | 0.8 | 1 | 0.4 | 0 | 1 | 0 | 0 |
| L3 | 0.8 | 0.2 | 0 | 0.4 | 1 | 0 | 0 | 0 |
| Sum |  |  |  |  |  |  | 0.72 |  |

The appropriate upstream probability or downstream probability for a zone is shown for each measurement point. The upstream/downstream probabilities for a zone are multiplied together to get the zone probability for a zone. For example, the zone probability for Zone G is 0.2*0.2*1*0.4*1*1=0.016. The zone probabilities are then summed and the sum of the zone probabilities is 0.72 for the example 700. Each zone probability is then divided by 0.72 to get the normalized zone probabilities in the last column. The zone probabilities are then shown in FIG. 7 in each zone as percentages.

The described examples and embodiments are to be considered in all respects only as illustrative and not restrictive. This written description uses examples and embodiments to disclose the invention, including best mode, and also to enable any person skilled in the art to practice the invention, including making and using any devices or systems and performing any incorporated methods. The examples and embodiments may be practiced in other specific forms. The patentable scope of this invention is defined by the claims and may include other examples that occur to those skilled in the art. Such other examples are intended to be within the claims if they have structural elements that do not differ from the literal language of the claims, or if they include equivalent structural element with insubstantial differences from the literal languages of the claims.

What is claimed is:

1. An apparatus comprising:
an upstream/downstream probability module that determines, for each measurement point in an electrical power system, an upstream/downstream probability, an upstream/downstream probability comprising a probability that a power quality event was upstream of a measurement point and a probability that the power quality event was downstream of the measurement point, each measurement point within an electrical power system, the electrical power system comprising a plurality of measurement points;
a zone module that identifies a plurality of zones within the electrical power system, wherein a measurement point defines a boundary between zones in the electrical power system;
an upstream/downstream module that identifies, for each measurement point and for each zone, if a power quality event in a zone is upstream or downstream of a measurement point; and
a zone probability module that determines a zone probability for each zone, a zone probability comprising a probability that the event happened in a zone, the zone probability module determining a zone probability for a zone by multiplying the upstream probability or the downstream probability for each measurement point, wherein the zone probability module uses the upstream probability of a measurement point when the upstream/downstream module determines that the zone is upstream of the measurement point and uses the downstream probability of the measurement point when the upstream/downstream module determines that the zone is downstream of the measurement point,
wherein at least a portion of the upstream/downstream probability module, the zone module, the upstream/downstream module and the zone probability module comprise one or more of hardware and executable code, the executable code stored on one or more computer readable storage media.

2. The apparatus of claim 1, further comprising a normalization module that normalizes each zone probability by dividing each zone probability by a sum of the zone probabilities determined by the zone probability module.

3. The apparatus of claim 1, further comprising an index module that, for a measurement point, calculates a plurality of indexes for the power quality event, wherein the upstream/downstream probability module determines the upstream/downstream probability for the measurement point from the plurality of indexes for the measurement point, wherein each index of the plurality of indexes comprises a probability that the power quality event occurred upstream or downstream of the measurement point.

4. The apparatus of claim 3, wherein the index module calculates an index for a measurement point by using an upstream/downstream prediction method that is based on measurement data taken at the at the measurement point, wherein each index of the plurality of indexes is calculated using a different upstream/downstream prediction method.

5. The apparatus of claim 3, further comprising an index weighting module that multiplies each index of a measurement point by a weighting factor to create a plurality of weighted indexes, wherein the upstream/downstream probability module determines the upstream/downstream probability for the measurement point from the plurality of weighted indexes for the measurement point.

6. The apparatus of claim 5, wherein a weighting factor for an index is based on one or more of:
- an overall reliability of an upstream/downstream prediction method used to determine the index;
- a reliability of an upstream/downstream prediction of the index based on measurement data of the power quality event measured at the measurement point;
- experimentation;
- simulation data; and
- a power quality event type.

7. The apparatus of claim 1, further comprising a power quality monitor at each measurement point and further comprising a synchronization module that sends a time of the event from a power quality monitor that detects the power quality event to each power quality monitor in the electrical power system, wherein the upstream/downstream probability module determines the upstream/downstream probability of a measurement point relative to the time of the event.

8. The apparatus of claim 7, wherein each power quality monitor comprises a memory module that stores measurement data sufficient to include a time delay between the time of the event and when the memory module received the time of the event, wherein the memory module stores measurement data sufficient for the upstream/downstream probability module to determine the upstream/downstream probability of a measurement point.

9. The apparatus of claim 8, wherein the memory module for a power quality monitor further stores pre-event data for a measurement point for a time prior to the earlier of:
- a time corresponding to the time of the event received from another power quality monitor that detected the power quality event; and
- a time corresponding to when the power quality monitor of the measurement point detects the power quality event.

10. The apparatus of claim 8, wherein the memory module for a power quality monitor further stores one or more of event data and post-event data for a measurement point, the event data and post-event data from a time after the later of:
- a time corresponding to the time of the event received from another power quality monitor that detected the power quality event; and
- a time corresponding to when the power quality monitor of the measurement point detects the power quality event, plus an amount of time sufficient for the upstream/downstream probability module to determine the upstream/downstream probability of a measurement point.

11. The apparatus of claim 7, wherein the synchronization module further determines if a power quality event detected by a power quality monitor at a measurement point corresponds to a power quality event detected by a different power quality monitor at a different measurement point and merges the power quality event detected by the power quality monitor at the measurement point with the power quality event detected by the different power quality monitor at the different measurement point in response to the synchronization module determining that the events are the same power quality event.

12. The apparatus of claim 1, further comprising a probability weighting module that multiplies each upstream probability or downstream probability for a measurement point used by the zone probability module by a probability weighting factor prior to the zone probability module determining a zone probability.

13. The apparatus of claim 12, wherein the probability weighting factor is determined by one or more of:
- a location of a zone with respect to a measurement point corresponding to the upstream probability or downstream probability;
- a power quality event type;
- an amount of current flow at the measurement point corresponding to the upstream probability or downstream probability;
- criticality of loads fed by power lines at the measurement point corresponding to the upstream probability or downstream probability; and
- historical data from previous determinations of zone probability in relation to determined causes for previous power quality events.

14. The apparatus of claim 1, further comprising a zone probability module that compares the zone probabilities to determine a highest zone probability, wherein the zone probability module reports the zone with the highest zone probability as the zone where the event most likely occurred.

15. A method comprising:
- determining, for each measurement point in an electrical power system, an upstream/downstream probability, an upstream/downstream probability comprising a probability that a power quality event was upstream of a measurement point and a probability that the power quality event was downstream of the measurement point, each measurement point within an electrical power system, the electrical power system comprising a plurality of measurement points;
- identifying a plurality of zones within the electrical power system, wherein a measurement point defines a boundary between zones in the electrical power system;
- identifying, for each measurement point and for each zone, if a power quality event in a zone is upstream or downstream of a measurement point; and
- determining a zone probability for each zone, a zone probability comprising a probability that the event happened in a zone, the zone probability is determined for a zone by multiplying, for each measurement point, the upstream probability or the downstream probability, wherein determining a zone probability comprises using the upstream probability of a measurement point when the zone is upstream of the measurement point and using the downstream probability of the measurement point when the zone is downstream of the measurement point.

16. The method of claim 15, further comprising normalizing each determined probability by dividing a probability for a zone by a sum of the zone probabilities determined for each zone.

17. The method of claim 15, further comprising, for a measurement point, calculating a plurality of indexes for the power quality event, wherein determining an upstream/downstream probability for a measurement point comprises using the plurality of indexes for the measurement point, wherein each index of the plurality of indexes comprises a probability that the power quality event occurred upstream or downstream of the measurement point.

18. The method of claim 17, further comprising multiplying each index of a measurement point by a weighting factor to create a plurality of weighted indexes, wherein determining an upstream/downstream probability for a measurement point comprises using the plurality of weighted indexes for the measurement point.

19. The method of claim 15, wherein the electrical power system comprises a power quality monitor at each measurement point and further comprising sending a time of the event from a power quality monitor that detects the power quality event to each power quality monitor in the electrical power system, wherein determining the upstream/downstream probability of a measurement point is relative to the time of the event.

20. The method of claim 15, further comprising multiplying each upstream probability or downstream probability for a measurement point by a probability weighting factor prior to determining a zone probability.

21. A system comprising:
   a plurality of power quality monitors, each power quality monitor located at a measurement point in an electrical power system;
   an index module that, for a measurement point, calculates a plurality of indexes for a power quality event, each index calculated using measurement data for the power quality event from the power quality monitor at the measurement point, wherein the index module calculates a plurality of indexes for each measurement point, wherein each index of the plurality of indexes comprises a probability that the power quality event occurred upstream or downstream of the measurement point;
   an upstream/downstream probability module that determines, for each measurement point, an upstream/downstream probability using the plurality of indexes for the measurement point, an upstream/downstream probability comprising a probability that the power quality event was upstream of a measurement point and a probability that the power quality event was downstream of the measurement point;
   a zone module that identifies a plurality of zones within the electrical power system, wherein a measurement point defines a boundary between zones in the electrical power system;
   an upstream/downstream module that identifies, for each measurement point and for each zone, if a power quality event in a zone is upstream or downstream of a measurement point; and
   a zone probability module that determines a zone probability for each zone, a zone probability comprising a probability that the event happened in a zone, the zone probability module determining a zone probability for a zone by multiplying the upstream probability or the downstream probability for each measurement point, wherein the zone probability module uses the upstream probability of a measurement point when the upstream/downstream module determines that the zone is upstream of the measurement point and uses the downstream probability of the measurement point when the upstream/downstream module determines that the zone is downstream of the measurement point.

22. The system of claim 21, further comprising a communication network that facilitates communication between the power quality monitors and further comprising a synchronization module that sends a time of the event from a power quality monitor that detects the power quality event to each power quality monitor in the electrical power system, wherein the upstream/downstream probability module determines the upstream/downstream probability of a measurement point relative to the time of the event.

* * * * *